WITNESSES
Theodore F. Wrobel
Irwin A. Shaw

INVENTOR
John W. Motto, Jr.
BY [signature]
ATTORNEY

United States Patent Office 3,546,488
Patented Dec. 8, 1970

3,546,488

PULSE AMPLIFIER CIRCUIT FOR CONTROLLING A GATE CONTROLLED SWITCH

John W. Motto, Jr., Greensburg, Pa., assignor to Westinghouse Electric Corporation, Pittsburgh, Pa., a corporation of Pennsylvania Continuation-in-part of application Ser. No. 387,822, Aug. 6, 1964. This application May 5, 1967, Ser. No. 636,525
Int. Cl. H03k 3/26
U.S. Cl. 307—284 2 Claims

ABSTRACT OF THE DISCLOSURE

A control pulse source and an amplifier including gate controlled switches for driving a slave operated gate controlled switch circuit. Two gate controlled switches are alternately charged to charge and discharge a capacitor from a power supply source to generate high level peak current pulses necessary to control a plurality of series connected gate controlled switches.

CROSS REFERENCE TO RELATED APPLICATION

The invention herein is related to the pulse amplifier for controlling a gate controlled switch disclosed in applicant's copending application entitled, Pulse Amplifier for Controlling a Gate Controlled Switch, Ser. No. 387,822, filed Aug. 6, 1964, which is assigned to the assignee of the present invention. This application is a continuation-in-part of the aforesaid copending application.

BACKGROUND OF THE INVENTION

This invention relates to electronic circuitry employing semiconductor devices and more particularly to a circuit for generating very high peak current pulses suitable for controlling a plurality of gate controlled switches when these devices are operated in series and in parallel.

The gate controlled switch (GCS) is a solid state semiconductor NPNP four-layer device somewhat similar to the silicon controlled rectifier (SCR) in that it has all the basic features of the SCR; however, it does not lose its control after the device has been rendered conductive. The gate controlled switch can turn off the load current by applying a pulse of opposite polarity to its gate electrode. It is somewhat similar to a switching transistor in performance except that it does not require a continuous control current to maintain the conduction state. The gate controlled switch, therefore, essentially embodies the desirable features of both the switching transistor and the silicon controlled rectifier. For a more comprehensive treatment of the characteristics of both the gate controlled switch and the silicon controlled rectifier, attention is directed to the handbook entitled, Silicon Controlled Rectifier Designers Handbook, by Robert Murray, Jr., and published by the Westinghouse Electric Corporation, 1st edition, 1963, pages 1–1 to 1–11 inclusive.

The ability to operate a plurality of gate controlled switches (GCS) coupled together in series for controlling the power delivered to a load is taught in Pat. No. 3,287,576 in the name of J. W. Motto, Jr., entitled, Semiconductor Switching Circuit Comprising Series-Connected Gate Controlled Switches to Provide Slave Control of Switches, and assigned to the assignee of the present invention. The conventional approach gate drive for such circuits, however, require relatively very high peak current pulses. For example, where a peak turn-off current of two amperes is required for a selected gate controlled switch, if then ten of these units are operated in series or parallel, a peak current of 20 amperes will be required. The generation of such pulses is the key to series and parallel operation and is also important when considering higher current gate controlled switches which will be developed in the future.

SUMMARY OF THE INVENTION

It is an object of the present invention, therefore, to provide a gate drive pulse amplifier suitable for controlling a large number of gate controlled switches operated in series and parallel.

It is a further object of the present invention to provide a pulse amplifier utilizing gate controlled switches for controlling a plurality of gate controlled switches operated in series.

It is still another object of the present invention to provide means for controlling a plurality of gate controlled switches by relatively high peak current control pulses.

Briefly, the subject invention contemplates the production of relatively high current pulses for the control of a gate controlled switch circuit and comprises a pair of gate controlled switches coupled across a source of supply voltage and having a common connection therebetween. A capacitor is coupled between the common connection of the gate controlled switches and the gate electrode of at least one gate controlled rectifier acting as a load. Coupled to the respective gate electrodes of the pair of gate controlled switches are gate pulses supplied from a control pulse source which alternately render the pair of gate controlled switches conductive and nonconductive but in opposite relation to one another so that when the first gate controlled switch of said pair is rendered conductive, the capacitor will charge to the level of the supply voltage through the conducting gate controlled switch and also through the gate of the gate controlled switch forming a load. In so doing, a relatively large pulse of current appears at the gate of the load gate controlled switch rendering it conductive. When the first gate controlled switch of said pair becomes nonconductive, the second which, up to this time has been nonconductive, is triggered "ON" providing a discharge path for the capacitor. The discharging of the capacitor will provide a pulse of current in the opposite direction to the gate electrode of the load gate controlled switch rendering it nonconductive. Also the present invention describes a control pulse source and suitable transformer coupling means for applying the required control pulses to the first and second gate controlled switch of said pair. By alternating charging and discharging the capacitor through said pair of semiconductor switches from the supply voltage, a relatively large current pulse of both positive and negative polarity is produced for controlling the load semiconductor switch.

Other objects and advantages of the present invention will become apparent when the following detailed specification is studied with reference to the following drawings in which:

DESCRIPTION OF PREFERRED EMBODIMENTS

Figure 1:
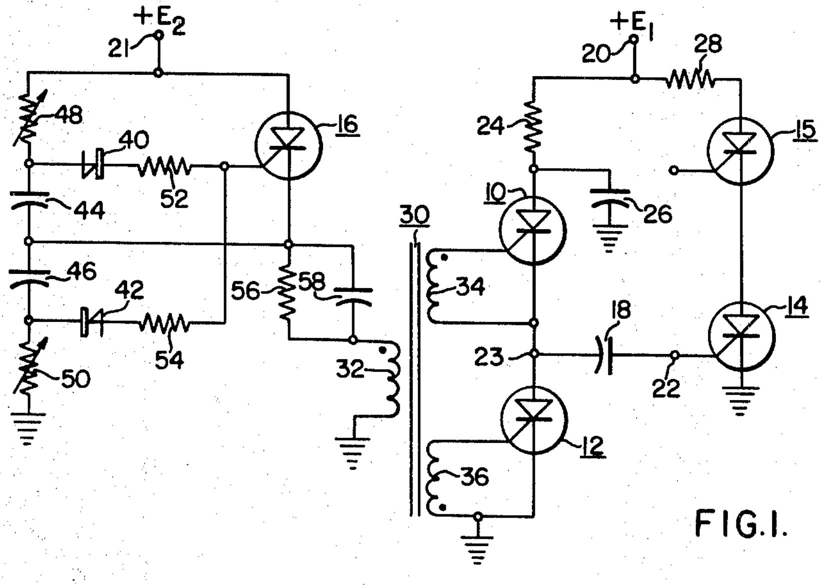
FIG. 1 is a schematic diagram of a first embodiment of the subject invention.

Referring now to FIG. 1, there is shown a first and a second gate controlled switch hereinafter referred to as GCS 10 and 12 connected together in series between a terminal 20 and a point of reference potential illustrated and hereinafter referred to as "ground." The series connection comprises connecting the cathode electrode of GCS 10 to the anode electrode of GCS 12 providing a common junction therebetween, identified as junction 23. The cathode electrode of GCS 12 is returned to ground while the anode electrode of GCS 10 is coupled to terminal 20 through resistance 24. A capacitor 26 is connected from the anode of GCS 10 to ground. Terminal 20 is adapted to be connected to a supply voltage $+E_1$ supplied from a power supply not shown.

Connected to the junction 23 is a capacitor 18 which is connected through an output terminal 22 to the gate electrode of GCS 14. GCS 14 comprises one of a plurality of gate controlled switches, illustrated as being connected in series (GCS 14 and GCS 15) acting as the load connected to the output terminal 22.

Connected to the gate electrode of GCS 10 is one end of secondary winding 34 of transformer 30. The other end of winding 34 is connected to the cathode electrode of GSC 10 which is common to the junction 23. Connected to the gate electrode of GCS 12 is one end of the secondary winding 36. The dot associated with each secondary winding is indicative of the terminals which have like instantaneous polarity. Therefore, it is evident that the secondary windings 34 and 36 are connected to the respective gate electrodes in opposite polarity with respect to one another. The primary winding 32 of transformer 30 is coupled to the GCS 16 by means of capacitor 58 and resistor 56. Transformer 30, moreover, is preferably a pulse transformer and more particularly a pulse transformer which provides a differentiated output across its secondary windings. This type of transformer is well known to those skilled in the art.

The anode electrode of GCS 16 is connected to terminal 21 which is adapted to be connected to a second source of power supply voltage $+E_2$ from a power supply not shown. Also coupled to terminal 21 is a variable resistance 48 connected in series to capacitor 44 which is in turn connected in series to capacitor 46 and the variable resistor 50. Connected to the common connection between variable resistor 48 and capacitor 44 is a four-layer semiconductor breakdown diode which is coupled to the gate electrode of GCS 16 by means of resistor 52. A second four-layer semiconductor breakdown diode 42 is connected between the common connection of capacitor 46 and variable resistor 50 to the gate electrode of GCS 16 by means of resistor 54. The breakdown diodes 40 and 42 are connected to their respective resistor capacitor combinations in an opposite polarity sense with respect to one another for purposes which will hereinafter become more evident. A connection is also made between the common junction between capacitors 44 and 46 and the cathode electrode of GCS 16.

In operation, the circuitry including GCS 16 and the breakdown diodes 40 and 42 acts like a free-running relaxation oscillator for periodically coupling the supply voltage $+E_2$ to the primary winding 32 through GCS 16. The operation is similar to a DC chopper circuit.

When the circuit is first energized, capacitor 44 will charge through resistors 48 and 56 and the primary winding 32; however, the value of resistor 56 is adapted to have a much smaller value than the variable resistor 48 so that for charging purposes, it is considered negligible. Capacitor 44 will charge up to the breakdown voltage of the breakdown diode 40 whereupon capacitor 44 discharges into the gate electrode of GCS 16 through resistor 52 turning-on GCS 16. The gate-to-cathode junction of GCS 16 acts like a forward biased diode and therefore is responsive to the discharge of capacitor 44 enabling the device to receive a pulse of current for rendering it conductive. When GCS 16 is turned on, the full source voltage $+E_2$ applied to terminal 21 will be realized momentarily across the primary winding 32 because the voltage across capacitor 58 cannot change instantaneously. This will produce gate pulses of mutually opposite polarity across the secondary windings 34 and 36. Transformer 30 is selectively chosen, for example, so that it saturates in about ten microseconds. This is desirable as a ten microsecond pulse width is more than adequate to control a gate controlled switch. When transformer 30 saturates, resistor 56 retains the current to a reasonable level.

When GCS 16 is turned on, capacitor 46 then charges through GCS 16 and resistor 50 until the breakdown voltage of breakdown diode 42 is obtained, at which time breakdown diode 42 becomes conductive and capacitor 46 is discharged out of the gate of GCS 16 providing a current pulse of the required polarity to turn GCS 16 off. The energy stored in the saturated core of transformer 30 is now released and results in opposite polarity gate pulses appearing across secondary windings 34 and 36.

The circuit combination including GCS 10 and GCS 12 in effect provide a pulse amplifier circuit for the pulses appearing across the secondary windings 34 and 36. Resistor 24 and capacitor 26 perform a fail-safe feature such that in the event that both GCS 10 and GCS 12 were triggered on simultaneously, a short circuit could not be established across the power supply connected at terminal 20. Resistor 24 would limit the current to a reasonable value and little damage would occur to the power supply for GCS 10 and GCS 12. Due to the low average power required by short duration gate pulses, little power is consumed in resistance 24 and capacitance 26 charges very near the supply voltage $+E_1$ and can be considered as the source in the following circuit description.

When a positive pulse is applied to the primary winding 32 of transformer 30, GCS 10 receives a positive turn-on pulse and capacitor 18 charges through GCS 10 and the gate-cathode junction of GCS 14. In the meantime, GCS 12 is rendered nonconductive by a negative pulse applied to its gate electrode through the secondary winding 36. When a negative pulse is applied to the primary winding 32, GCS 10 receives a negative turn-off control signal and switches off the charging current of capacitor 18. A positive pulse is simultaneously applied to GCS 12 turning it on and discharging capacitor 18 out of the gate of GCS 14. This discharing current will be switched off when the next positive pulse is applied to the primary winding 32, turning GCS 12 off and GCS 10 on. The rise time of the turn-on and turn-off pulses correspond to the turn-on times of GCS 10 and GCS 12, respectively, and will be extremely fast. Because capacitor 18 is being charged and discharged from a supply voltage $+E_1$, a gain is realized which is capable of controlling a plurality of gate controlled switches connected as a load.

Figure 2:
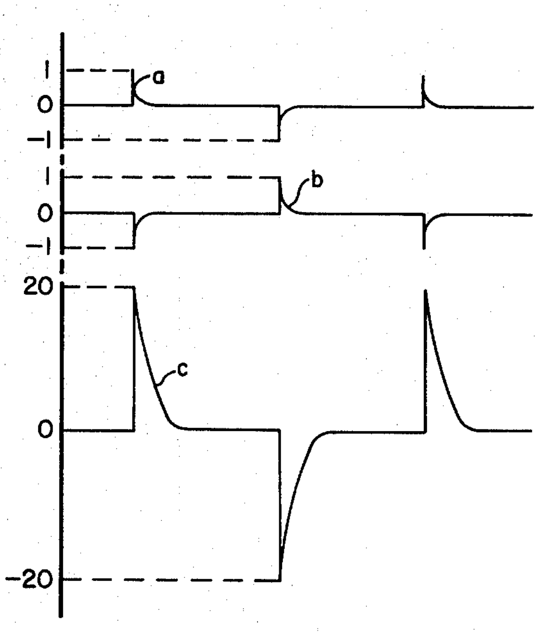
FIG. 2 is a graph helpful in understanding the operation of the embodiment shown in FIG. 1; and, FIG. 3 is a schematic diagram illustrative of a second embodiment of the subject invention.

An examination of FIG. 2 will illustrate this phenomenon. Curve a is a representation of the current pulse applied to the gate electrode of GCS 10 from the secondary winding 34. It illustrates that positive and negative pulses of 1 ampere are alternately applied to the gate. Curve *b* is illustrative of the gate pulse applied to gate electrode of GCS 12. It is to be noted that it is also an alternately positive and negative pulse of 1 ampere; however, curves *a* and *b* are 180 degrees out of phase with respect to one another resulting from the relative polarity connection of the secondary windings 34 and 36. Curve *c* is illustrative of the current pulse generated and applied to the gate electrode of GCS 14 as capacitor 18 is made to charge and discharge. It is to be noted that the amplitude of a curve *c* is considerably larger than the amplitude of curves *a* and *b* and is shown illustrated as positive and negative current pulses having peaks of 20 amperes.

Figure 3:
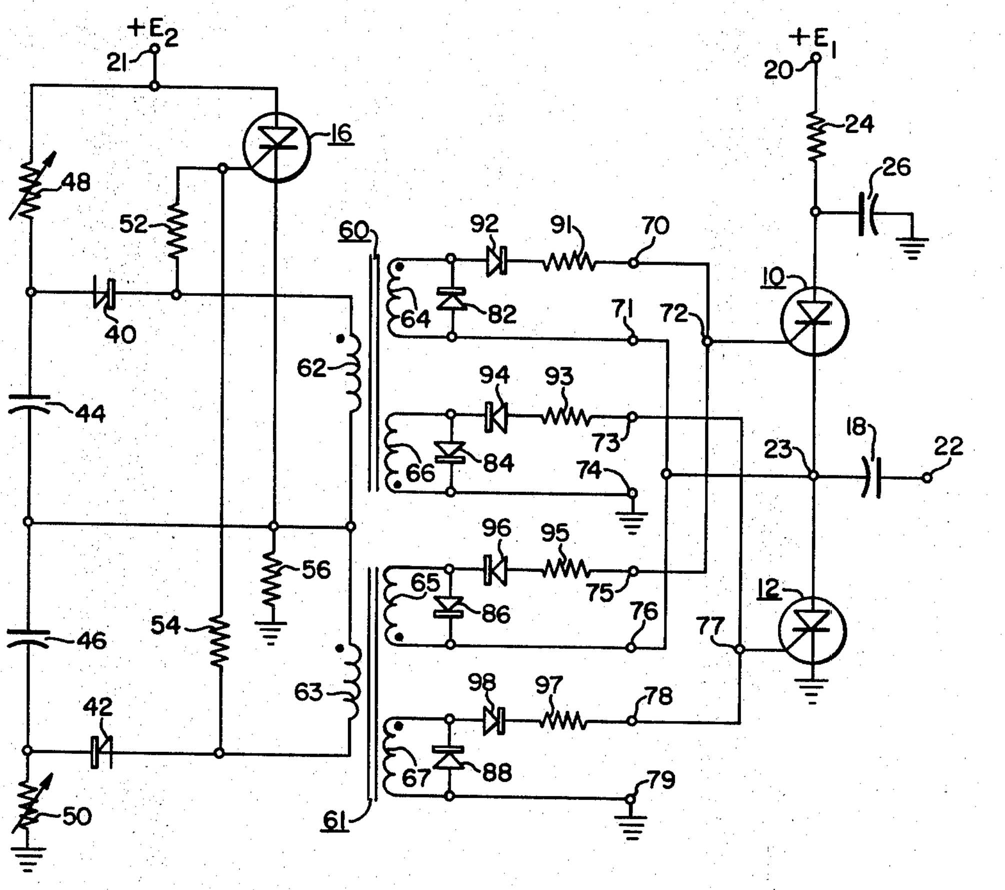

FIG. 3 is illustrative of a second embodiment of the subject invention and it will be observed that the circuitry is identical with respect to the pulse amplifier portion comprising GCS 10 and GCS 12. The major difference in the embodiment of FIG. 3 is the gate driver circuitry utilized to feed gate pulses to GCS 10 and GCS 12, respectively. The embodiment shown in FIG. 3 utilized two transformers 60 and 61 for coupling control pulses to the gate electrode of GCS 10 and GCS 12, respectively, from a relaxation oscillator source similar to the circuit described in FIG. 1.

The primary windings 62 and 63 are shown connected together in series to mutually opposite terminals of breakdown diodes 40 and 42, respectively. Their respective other terminals are conected to capacitors 44 and 46, respectively. Capacitor 44 is then adapted to be connected to terminal 21 through variable resistor 48 while capacitor 46 is adapted to be connected to ground through variable resistor 50. GSC 16 has its anode electrode coupled directly to terminal 21 while its cathode electrode is returned to ground through resistor 56. The gate electrode of GCS 16 is connected to one side of primary windings 62 and 63 which sides are oppositely poled from one another. Also a connection is established between the connection between primary windings 62 and 63, the connection between capacitors 44 and 46 and the cathode electrode of GCS 16. Both transformers 60 and 61 are adapted to have two secondary windings 64 and 66; and 65 and 67 respectively. Diodes 82, 84, 86 and 88 are connected across the secondary windings 64, 66, 65 and 67 respectively, for reasons given subsequently. Diodes 92 and 98 are connected respectively to secondary windings 64 and 67 for directing only positive pulses to respective terminals 70 and 78; similarly, diodes 94 and 96 are connected to secondary windings 66 and 96 and 65 respectively for directing only negative pulses to respective terminals 73 and 75. By coupling terminals 70 and 75 together at junction 72 and connecting this junction to the gate electrode of GCS 10, both positive and negative gate control pulses will be alternately applied thereto from secondary windings 64 and 65, respectively. At the same time and corresponding to these positive and negative gate control pulses are negative and positive pulses at terminals 73 and 78 supplied by secondary windings 66 and 67. By connecting terminals 73 and 78 together at junction 77 and connecting junction 77 to the gate electrode of GCS 12, the required pulse timing relationship is established for alternate operation of GCS 10 and 12.

In operation, when the circuit is energized, GCS 16 will block the applied voltage $+E_2$ and capacitor 44 will charge through the variable resistor 48 and resistor 56 until the voltage thereacross reaches the breakdown voltage of the breakdown diode 40, at which time breakdown diode 40 will conduct and capacitor 44 will discharge into the primary winding 62 for producing the required gate pulses in the secondary windings 64 and 66. At the same time, the small amount of energy of capacitor 44 is coupled through resistor 52 and provides a turn-on pulse for GCS 16. GCS 16 operates at a very low current, 100 ma. for example, and the power dissipated in resistor 52 is small permitting the circuit to operate at high efficiency. When GCS 16 becomes conductive, capacitor 46 will then charge through variable resistor 50 and GCS 16 until the voltage across capacitor 46 reaches the breakdown voltage of breakdown diode 42, at which time capacitor 46 discharges into the primary winding 63 and the opposite polarity gate pulses are induced in the secondary windings 65 and 67 of transformers 61. A small amount of energy of capacitor 46 is coupled through resistor 54 to provide a turn-off pulse for GCS 16. GCS 16 turns off and the cycle is repeated. The spacing between the turn-on and turn-off pulses can be varied by the two variable resistors 48 and 50 which provide a wide range of duty cycles and frequencies of the output control pulses.

The transformer coupling of gate pulses to a gate controlled switch often requires special design considerations. For example, the transformer described with respect to FIG. 1 was preferably a differentiating transformer. Also when a pulse is transmitted through a pulse transformer, the energy stored in the leakage reactance, stray capacitance and core of the transformer will discharge on the termination of the pulse and will produce a voltage in the secondary of the opposite polarity. This is termed the "back swing" of the transformer and can produce undesirable results if it is of a large enough magnitude. If a turn-off pulse is transmitted, the back swing could represent a turn-on pulse to the gate controlled switch and will immediately turn it back on. When a turn-on pulse is transmitted, the back swing could represent a turn-off pulse turning the gate controlled switch back off. The undesirable back swing is prevented by the use of clamping diodes 82, 84, 86 and 88 coupled across the respective secondary windings. The series connected diodes 92 through 98 are helpful in preventing the forward voltage drop of diodes 82 through 88 from providing any undesirable triggering. The series diodes, however, prevent a transmission of the opposite polarity pulse through the transformer, requiring that two secondary windings be utilized for each gate controlled switch controlled.

The embodiment shown in FIG. 3 alternately triggers GCS 10 and GCS 12 between mutually opposite conductive and nonconductive states to charge and discharge capacitor 18 through a load comprising at least one gate controlled switch, not shown, as described with respect to the embodiment of FIG. 1.

While there has been shown and described what is at present considered to be the preferred embodiments of the invention, modifications thereto will readily occur to those skilled in the art. It is not desired therefore that the invention be limited to those specific arrangements shown and described, but it is to be understood that all equivalents, alterations, and modifications within the spirit and scope of the present invention are herein meant to be included.

What I claim is:

1. A gate drive pulse amplifier adapted to control a gate controlled switch circuit comprising in combination: a source of supply voltage; a first and a second gate controlled switch, each having a gate turn-off characteristic a cathode, an anode, and a gate electrode; circuit means coupling said first and said second gate controlled switch in series to said source of power supply voltage and having a common connection therebetween; a capacitor coupled to said common connection; a load circuit comprising at least one gate controlled switch having a gate turn-off characteristic connected to said capacitor; and means including a control pulse source and transformer means for coupling control pulses to said gate electrode of both said first and said second gate controlled switch from said control pulse source, said transformer means comprising at least one primary winding and at least two pairs of secondary windings wherein each pair comprises a first and second secondary winding, diode means connected to each first and second secondary winding of said pair of windings, said pair of windings alternately providing a positive and a negative control pulse, said first secondary windings of each of said pairs being coupled to the gate and cathode electrodes of said first gate controlled switch and said second secondary windings being coupled to the gate and cathode electrodes of said second gate controlled switch respectively and being poled to render said first and said second gate controlled switch operative in mutually opposite conduction states, said capacitor means being operable to charge from said source of supply voltage through said first gate controlled switch and said at least one other gate controlled switch for effecting turn-on of said at least one other gate controlled switch and being further operable to discharge through said second gate controlled switch and said at least one other gate controlled switch for effecting turn-off of said one other gate controlled switch.

2. A gate drive pulse amplifier adapted to control a gate controlled switch circuit comprising in combination: a source of supply voltage; a first and a second gate controlled switch, each having a gate turn-off characteristic a cathode, an anode, and a gate electrode; circuit means coupling said first and said second gate controlled switch in series to said source of power supply voltage and having a common connection therebetween; a capacitor coupled to said common connection; a load circuit comprising at least one gate controlled switch having a gate turn-off characteristic connected to said capacitor; and means including a control pulse source and transformer means for coupling control pulses to said gate electrode of both said first and said second gate controlled switch from said control pulse source, said transformer means comprising a first and a second transformer, said first and said second transformer each having at least one primary winding and at least two secondary windings, said means further including first diode means coupled across each said at least two secondary windings of said first and said second transformer and being poled to eliminate back swing of the pulse developed thereacross, second diode means coupled to each said at least two secondary windings to provide pulse output of predetermined polarity, and circuit means coupling said at least two secondary windings together to the gate electrode of said first and said second gate controlled switch respectively for providing both positive and negative control pulses thereto.

References Cited

UNITED STATES PATENTS

| | | | |
|---|---|---|---|
| 2,888,579 | 5/1959 | Wanlass | 307—208 |
| 3,015,741 | 1/1962 | Richards | 307—228 |
| 3,184,653 | 5/1965 | Hutson | 307—305 X |
| 3,197,716 | 7/1965 | Wright et al. | 331—111 |
| 3,209,174 | 9/1965 | Cole | 307—271 |
| 3,248,634 | 4/1966 | Fudaley et al. | 307—252 X |
| 3,287,576 | 11/1966 | Motto | 307—284 X |
| 3,299,297 | 1/1967 | Motto | 307—252 |
| 3,308,800 | 3/1967 | Motto et al. | 308—252 X |
| 3,335,291 | 8/1967 | Gutzwiller | 307—252 |

STANLEY T. KRAWCZEWICZ, Primary Examiner

U.S. Cl. X.R.

307—252, 305; 331—111